US010991901B2

(12) United States Patent
Fan et al.

(10) Patent No.: US 10,991,901 B2
(45) Date of Patent: Apr. 27, 2021

(54) ORGANIC ELECTROLUMINESCENT DEVICE

(71) Applicant: BOE TECHNOLOGY GROUP CO., LTD., Beijing (CN)

(72) Inventors: Xing Fan, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 456 days.

(21) Appl. No.: 15/751,445

(22) PCT Filed: Jun. 19, 2017

(86) PCT No.: PCT/CN2017/088940
§ 371 (c)(1),
(2) Date: Feb. 8, 2018

(87) PCT Pub. No.: WO2018/045787
PCT Pub. Date: Mar. 15, 2018

(65) Prior Publication Data
US 2020/0227666 A1 Jul. 16, 2020

(30) Foreign Application Priority Data
Sep. 9, 2016 (CN) .......................... 201610816004.6

(51) Int. Cl.
*H01L 51/50* (2006.01)
(52) U.S. Cl.
CPC ...... *H01L 51/5064* (2013.01); *H01L 51/5036* (2013.01); *H01L 2251/558* (2013.01)
(58) Field of Classification Search
CPC .......................... H01L 51/5064; H01L 51/5036
See application file for complete search history.

(56) References Cited

U.S. PATENT DOCUMENTS 9,006,713 B2    4/2015  Park et al.
2007/0290213 A1* 12/2007 Kobayashi .......... H01L 51/5265
                                              257/79
(Continued)

FOREIGN PATENT DOCUMENTS

CN    101533852 A    9/2009
CN    103647026 A    3/2014
(Continued)

OTHER PUBLICATIONS

Office Action received for Chinese Patent Application No. 201610816004.6, dated Jun. 28, 2017, 13 pages (7 pages of English Translation and 6 pages of Office Action).
(Continued)

*Primary Examiner* — Christine A Enad
(74) *Attorney, Agent, or Firm* — Womble Bond Dickinson (US) LLP

(57) ABSTRACT

This disclosure relates to an organic electroluminescent device, comprising: a light emitting layer comprising a plurality of light emitting regions arranged in an array, each light emitting region being an organic electroluminescent region; an electron transport layer, a cathode and a transflective layer successively disposed in a first direction from the light emitting layer towards a light emergent side of the organic electroluminescent device starting from the light emitting layer; and a hole transport layer, an anode and a reflective layer successively disposed in a second direction opposite to the first direction starting from the light emitting layer. In addition, in a projection region of at least one light emitting region on the hole transport layer, the hole transport layer has at least two portions of different thicknesses for selecting a wavelength range of light emitted by the at least one light emitting region and/or enhancing the emitted light.

3 Claims, 2 Drawing Sheets

(56) References Cited

U.S. PATENT DOCUMENTS

| | | |
|---|---|---|
| 2009/0231243 A1 | 9/2009 | Song |
| 2009/0261722 A1 | 10/2009 | Koo et al. |
| 2011/0042697 A1 | 2/2011 | Lee et al. |
| 2014/0117315 A1 | 5/2014 | Kim et al. |
| 2014/0145163 A1 | 5/2014 | Lee |
| 2014/0183461 A1 | 7/2014 | Kim et al. |
| 2015/0115231 A1 | 4/2015 | Lee et al. |
| 2016/0380224 A1* | 12/2016 | Kim .................. H01L 51/0005 257/40 |
| 2017/0033306 A1* | 2/2017 | Song .................. H01L 51/0052 |
| 2017/0084857 A1* | 3/2017 | Song .................. H01L 27/3213 |
| 2017/0110669 A1* | 4/2017 | Im ......................... C09K 11/06 |

FOREIGN PATENT DOCUMENTS

| | | |
|---|---|---|
| CN | 103794622 A | 5/2014 |
| CN | 103839968 A | 6/2014 |
| CN | 104851980 A | 8/2015 |
| CN | 106129265 A | 11/2016 |

OTHER PUBLICATIONS

International Search Report received for PCT Patent Application No. PCT/CN2017/088940, dated Sep. 27, 2017, 6 pages (2 pages of English Translation and 4 pages of Original Document).

\* cited by examiner

ORGANIC ELECTROLUMINESCENT DEVICE

The present application is the U.S. national phase entry of PCT/CN2017/088940, with an international filling date of Jun. 19, 2017, which claims the priority of the Chinese patent application No. 201610816004.6 filed on Sep. 9, 2016, disclosures of both are incorporated herein by reference.

FIELD

The present disclosure relates to the field of organic electroluminescence, and in particular, to an organic electroluminescent device.

BACKGROUND

In a conventional approach, as shown in FIG. 1, an organic electroluminescent device with a microcavity structure generally comprises a light emitting layer. Specifically, the light emitting layer comprises a plurality of light emitting regions 11, i.e., a plurality of organic electroluminescent regions, arranged in an array. Colors of the light emitting regions may comprise red, green and blue, denoted with R, G, and B respectively. In addition, starting from a side of the light emitting layer, there are successively disposed a hole transport layer, an anode 22 and a reflective layer 23. Moreover, starting from the other side of the light emitting layer, there are further successively disposed an electron transport layer 31, a cathode 32 and a transflective layer 33. In addition, the hole transport layer specifically comprises hole transport regions 21 corresponding to the light emitting region of each color. That is to say, the light emitting region of each color corresponds to a hole transport region 21 respectively, and each hole transport region 21 has a specific thickness. In this way, a microcavity structure is formed between the reflective layer and the transflective layer. Thus, it can be seen that such a microcavity structure comprises various layer structures disposed between the reflective layer and the transflective layer.

Generally, the light emitting region of each color is formed by an organic luminescent material. Typically, the wavelength range of light emitted by an organic luminescent material is relatively wide. However, the wavelength range of light for each color required by an organic electroluminescent device is relatively narrow. For this reason, the microcavity structure as described above is generally formed. Such a microcavity structure shows effects such as selection, narrowing and enhancement of light. In particular, with the microcavity structure, it may be possible to select a specific range of wavelengths for each color, and in the meanwhile, to enhance the intensity of light in the selected wavelength range as well. As an example, by adjusting thicknesses of the hole transport regions corresponding to the light emitting region of each color, it may be possible to adjust the length of the microcavity corresponding thereto, and thereby to select light in a different wavelength range as well as its intensity. However, such an adjustment scheme often also leads to problems such as brightness decline, color deviation, etc. of the organic electroluminescent device at large viewing angles.

SUMMARY

The present disclosure provides an organic electroluminescent device to eliminate or alleviate one or more of the existing drawbacks as mentioned above.

According to an embodiment of the present disclosure, there is provided an organic electroluminescent device. The organic electroluminescent device comprises: a light emitting layer comprising a plurality of light emitting regions arranged in an array, each light emitting region being an organic electroluminescent region; an electron transport layer, a cathode and a transflective layer successively disposed in a first direction from the light emitting layer towards a light emergent side of the organic electroluminescent device starting from the light emitting layer; as well as a hole transport layer, an anode and a reflective layer successively disposed in a second direction opposite to the first direction starting from the light emitting layer. In addition, in a projection region of at least one light emitting region on the hole transport layer, the hole transport layer has at least two portions of different thicknesses for selecting a wavelength range of light emitted by the at least one light emitting region and/or enhancing the emitted light.

Optionally, in the projection region of the at least one light emitting region on the hole transport layer, the hole transport layer has two portions of different thicknesses.

Optionally, in the projection region of the at least one light emitting region on the hole transport layer, the hole transport layer has two hole transport regions of different thicknesses that are disposed close to each other.

Optionally, in a further example of the above embodiment, the two hole transport regions of different thicknesses cover half of the projection region respectively.

Optionally, in a further embodiment of the present disclosure, the hole transport layer comprises a first hole transport sub-layer and a second hole transport sub-layer that are superimposed over each other. According to such a specific embodiment, in the projection region of the at least one light emitting region on the hole transport layer, the first hole transport sub-layer has a first hole transport sub-region, and the second hole transport sub-layer has a second hole transport sub-region. Further, the second hole transport sub-region and the first hole transport sub-region at least partially overlap.

Optionally, in a further example of the above embodiment, an overlapping portion of the second hole transport sub-region and the first hole transport sub-region covers half of the first hole transport sub-region.

Optionally, the first hole transport sub-region fully covers the above mentioned projection region.

Optionally, the second hole transport sub-region covers half of the above mentioned projection region.

Further optionally, two first hole transport sub-regions which correspond respectively to two adjacent light emitting regions border on each other. That is to say, the two first hole transport sub-regions adjacent to each other form a whole.

Optionally, in a further embodiment of the present disclosure, the plurality of light emitting regions comprise n light emitting regions emitting light of different colors respectively, wherein n is a natural number greater than or equal to 3. In such a specific embodiment, the hole transport layer comprises n hole transport regions, wherein in the projection region of the at least one light emitting region on the hole transport layer, there are at least two hole transport regions of different thicknesses.

Optionally, in a further example of the above embodiment, at least one hole transport region covers both projection regions of two adjacent light emitting regions on the hole transport layer and a region therebetween.

DETAILED DESCRIPTION OF THE EMBODIMENTS

Figure 1:
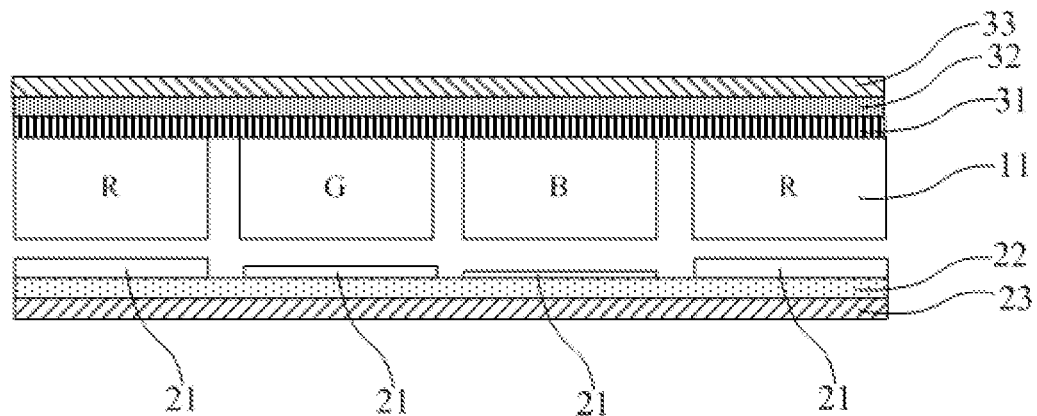
FIG. 1 is a schematic diagram of an organic electroluminescent device with a microcavity structure according to the prior art.

In the following, technical solutions in the embodiments of the present disclosure will be described clearly and completely in connection with the drawings. Obviously, the described embodiments are only part of the embodiments of the present disclosure, and not all of them.

Based on the embodiments in the present disclosure, all the other embodiments obtained by those of ordinary skills in the art under the premise of not paying out creative work pertain to the protection scope of the present disclosure.

In the drawings, the following reference signs are respectively used to denote corresponding components: 11 light emitting region, 21 hole transport region, 22 anode, 23 reflective layer, 31 electron transport layer, 32 cathode, 33 transflective layer, 110 light emitting region, 210 hole transport region, 211 first hole transport sub-region, 212 second hole transport sub-region, 220 anode, 230 reflective layer, 310 electron transport layer, 320 cathode, and 330 transflective layer.

Figure 2:
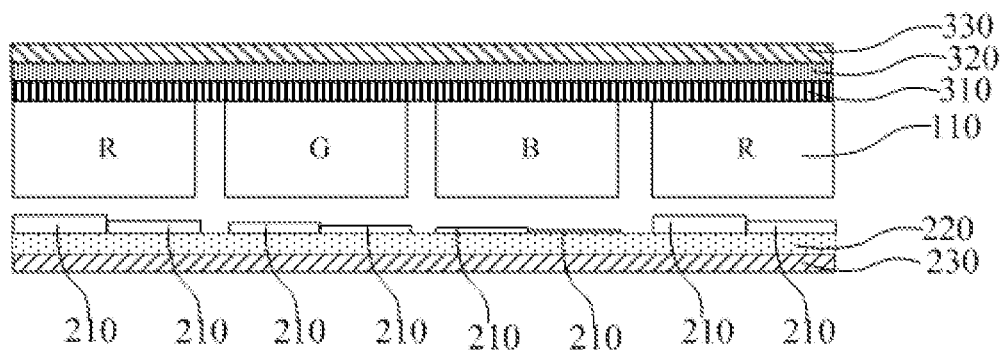
FIG. 2 is a schematic diagram of an organic electroluminescent device according to an embodiment of the present disclosure.
Figure 3:
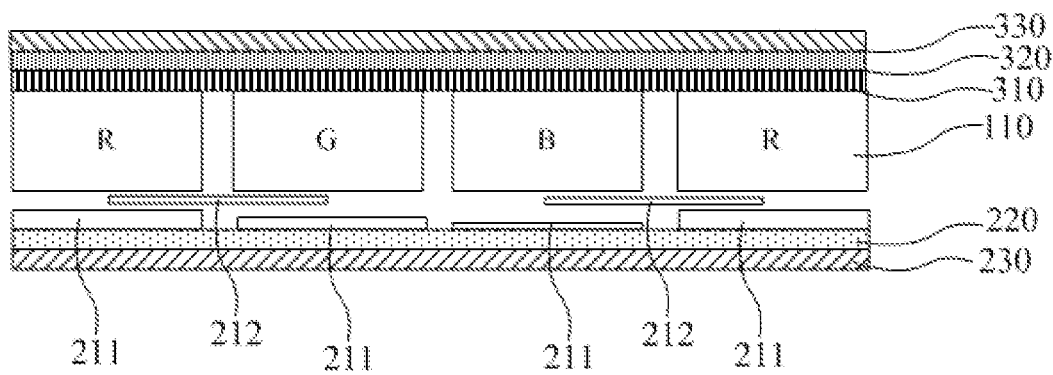
FIG. 3 is a schematic diagram of an organic electroluminescent device according to another embodiment of the present disclosure.
Figure 4:
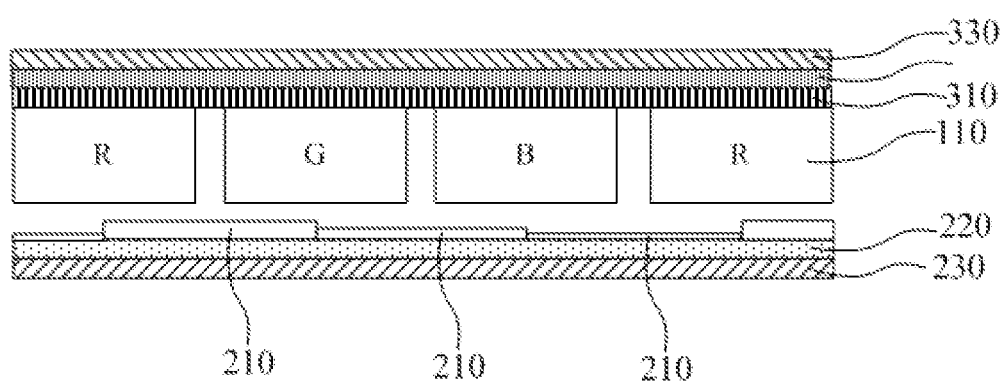
FIG. 4 is a schematic diagram of an organic electroluminescent device according to yet another embodiment of the present disclosure.

According to an embodiment of the present disclosure, as shown in FIG. 2, FIG. 3 and FIG. 4, an organic electroluminescent device comprises a light emitting layer. In particular, the light emitting layer comprises a plurality of light emitting regions 110 arranged in an array, and each of the light emitting regions 110 is an organic electroluminescent region. Colors of the light emitting regions may comprise red, green and blue, denoted with R, G, and B respectively. In addition, the organic electroluminescent device may further comprise: a hole transport layer, an anode 220 and a reflective layer 230 successively disposed in a direction away from a light emergent side of the organic electroluminescent device starting from the light emitting layer; and an electron transport layer 310, a cathode 320 and a transflective layer 330 successively disposed in a direction close to the light emergent side of the organic electroluminescent device starting from the light emitting layer. Further, each light emitting region 110 has a projection region on the hole transport layer. In such a projection region, the hole transport layer comprises at least two portions of preset thicknesses.

It should be noted that light emitting regions of different colors have different optimal thicknesses of microcavity, and different thicknesses of the at least two portions of the hole transport layer corresponding to a light emitting region of a different color are calculated and selected according to such optimal thicknesses of microcavity.

In this embodiment, the organic electroluminescent device comprises a light emitting layer. Such a light emitting layer comprises a plurality of light emitting regions arranged in an array, and each of the light emitting regions is an organic electroluminescent region. In addition, the organic electroluminescent device further comprises: a hole transport layer, an anode and a reflective layer successively disposed in a direction away from the light emergent side of the organic electroluminescent device starting from the light emitting layer; and an electron transport layer, a cathode and a transflective layer successively disposed in a direction close to the light emergent side of the organic electroluminescent device starting from the light emitting layer. Furthermore, each luminescent region has a projection region on the hole transport layer. In such a projection region, the hole transport layer has at least two portions of different thicknesses. In such a way, light emitted by the light emitting region will get further selected and enhanced after passing at least two microcavities of different lengths. Thus, the selected wavelength range of light is allowed to become relatively narrow, and in the meanwhile, light of the selected wavelength range can also get further enhanced, thereby increasing brightness of the organic electroluminescent device. As compared with a conventional solution, the organic electroluminescent device according to the present embodiment not only increases brightness of the organic electroluminescent device, but also effectively reduces its color deviation.

According to a different embodiment of the present disclosure, in the projection region of at least one light emitting region on the hole transport layer, the hole transport layer may have two, three or more portions of different thicknesses. The present application is not limited in this regard. In view of a small size of light emitting region and correspondingly a small size of projection region, as an alternative, the hole transport layer has two portions of different thicknesses. This further helps to promote the feasibility and convenience of manufacturing, as well as improvements on the overall luminous effect of the organic electroluminescent device.

As a further optional example, in the projection region of the at least one light emitting region on the hole transport layer, the hole transport layer has two hole transport regions of different thicknesses that are disposed proximately to each other. Thus, the hole transport layer is relatively simple in structure and easy to manufacture. Meanwhile, it is also favorable for improving the overall luminous intensity of the organic electroluminescent device.

As an alternative, the cathode may act as a transflective layer at the same time. That is to say, the cathode and the transflective layer form a single layer. This results in a simpler structure and a smaller thickness of the organic electroluminescent device, thereby helping to simplify the machining process.

In the projection region of the at least one light emitting region on the hole transport layer, the at least two portions of different thicknesses of the hole transport layer may be implemented in different manners. In an optional manner, as shown in FIG. 2, the hole transport layer has two hole transport regions 210 of different thicknesses which are disposed proximately to each other. Thus, light emitted by each light emitting region can be selected and enhanced after passing two microcavity structures of preset thicknesses. This makes the structure relatively simple and the manufacturing more convenient.

With respect to specific settings of the two hole transport regions 210, different ways may be employed. In particular, as shown in FIG. 2, the light emitting regions 110 are rectangular. At this point, a direction where the long side of the rectangle is located can be selected as a first direction, and a direction where the short side of the rectangle is located can be selected as a second direction. With reference to the figure, in this case, a length of the hole transport region 210 in the first direction is half of that of the light emitting region in the first direction, and the length of the hole transport region 210 in the second direction is equal to that of the light emitting region in the second direction.

As such, the two hole transport regions of preset thicknesses disposed proximately as a whole are consistent with the light emitting region in size and disposed opposite to it. This allows for a simple device structure, and is convenient for machining and manufacturing. In addition, an organic electroluminescent device with such a structure is further suitable for situations where the resolution requirement for the organic electroluminescent device is not too high. The reason lies in that, during the manufacturing procedure, the process employed for the single light emitting region and the hole transport region is the same. That is, the minimum precision of the process is identical. Therefore, when the process precision employed for the hole transport region is minimum, the size of the single light emitting region is not at the minimum precision. Namely, the resolution is relatively low.

It should be noted that the rectangular light emitting region and hole transport region are just a specific implementation, and yet shapes of the light emitting region and hole transport region are not limited thereto. As a specific example, the two hole transport regions as a whole cover the projection region, and each of the hole transport regions occupies half of the projection region. As such, at each projection region, the two portions of preset thicknesses of the hole transport layer have the same area. Thus, the same selection of the wavelength range of light emitted by a light emitting region is achieved by microcavities of two thicknesses, thereby effectively improving the color deviation. In the meanwhile, since the hole transport region employs a minimum precision of process, the size of the light emitting region is doubled with relative to that of the hole transport region.

When the resolution requirement for the organic electroluminescent device is relative high, at each projection region, the two hole transport regions of different thicknesses of the hole transport layer may have other specific settings. As shown in FIG. 3, the hole transport layer comprises a first hole transport sub-layer 211 and a second hole transport sub-layer 212. In this case, at each projection region, the first hole transport sub-layer 211 has a first hole transport sub-region, and the second hole transport sub-layer 212 has a second hole transport sub-region. In addition, the second hole transport sub-region 212 and the first hole transport sub-region 211 at least partially overlap.

As such, at each projection region, the hole transport layer has two different thicknesses. In particular, one is the thickness of the first hole transport sub-region 211, and the other is an superposed thickness of the first hole transport sub-region and the second hole transport sub-region. Thus, on one hand, the hole transport layer has two portions of different thicknesses at each projection region, and the brightness and viewing angle of the organic electroluminescent device are thereby guaranteed; and in the meanwhile, on the other hand, the light emitting region, the first hole transport sub-region and the second hole transport sub-region are all allowed to employ the minimum precision of process, and thereby, the high resolution of the organic electroluminescent device is guaranteed.

In particular, as shown in FIG. 3, the overlapped portion of the second hole transport sub-region and the first hole transport sub-region covers half of the first hole transport sub-region 211.

As such, at each projection region, the two portions of different thicknesses of the hole transport layer have the same area. Thus, the same selection of the wavelength range of light emitted by a light emitting region is achieved by microcavities of two thicknesses, thereby improving the color deviation.

Further, in particular, for shapes and sizes of the light emitting region and the first hole transport sub-region, those as shown in FIG. 3 may be employed. In this case, the light emitting region 110 is rectangular, and the direction where the long side of the rectangle is located is a first direction, and the direction where the short side of the rectangle is located is a second direction.

In particular, the length of the first hole transport sub-region 211 in the first direction is equal to that of the light emitting region in the first direction, and the length of the first hole transport sub-region 211 in the second direction is equal to that of the light emitting region in the second direction. The light emitting region and the first hole transport sub-region that have such shapes and sizes are relatively convenient to machine.

Still further, as shown in FIG. 3, the length of the second hole transport sub-region 212 in the first direction is equal to the sum of the length of the light emitting region in the first direction and a first gap spacing. In addition, the length of the second hole transport sub-region 212 in the second direction is equal to that of the light emitting region in the second direction. The second hole transport sub-region that has such a shape and size allows a convenient machining.

It should be noted that, the rectangular light emitting region, first hole transport sub-region and second hole transport sub-region are just specific implementations, and shapes of the light emitting region, the first hole transport sub-region and the second hole transport sub-region are not limited thereto. In particular, it is only required that the first hole transport sub-region covers the projection region, and the second hole transport sub-region covers half of the projection region. As such, the two portions of different thicknesses of the hole transport layer at each projection region have the same area. Thus, the same selection of the wavelength range of light emitted by a light emitting region is obtained by microcavities of two thicknesses, thereby effectively improving the color deviation.

On the premise that the organic electroluminescent device is not affected in resolution, another way may be further employed, leading to a simpler structure. As shown in FIG. 4, the light emitting regions 110 are rectangular, and there are n colors of the light emitting regions, wherein n is a natural number greater than or equal to 3. In this case, the hole transport layer comprises n hole transport regions 210 of preset thicknesses which are disposed proximately to each other. Moreover, the hole transport layer is offset relative to the light emitting layer, and at each projection region, the hole transport layer has at least two hole transport regions 210 of preset thicknesses.

As such, it is still possible to employ the minimum precision of process to manufacture the light emitting region, and at a portion of the projection region, hole transport regions of two thicknesses are allowed to exist. Thus, the brightness of the organic electroluminescent device may be guaranteed to a certain degree. In general, light emitting regions of different colors have different optimum thicknesses of hole transport region. In the structure as shown by FIG. 4, a hole transport region of the same thickness is opposite to light emitting regions of two different colors. Therefore, it is difficult for the light emitting regions of these two colors to get optimum thicknesses of hole transport region, and the effect is lower than the strongest efficiency which can be achieved by the optimum microcavity. While even so, as compared with the efficiency in an actual application, certain promotion can still be obtained.

In particular, for the shape and size of the light emitting region, various settings may be adopted. As shown in FIG. 4, the light emitting region 110 is a rectangle, and the direction where the long side of the rectangle is located is a first direction, and the direction where the short side of the rectangle is located is a second direction. In this case, the length of each hole transport region 210 in the first direction is equal to the sum of the length of a light emitting region 110 in the first direction and the distance between two adjacent light emitting regions. In addition, the length of the hole transport region 210 in the second direction is equal to that of the light emitting region 110 in the second direction. In such a case, both the light emitting region and the hole transport region may employ a minimum precision of process, thereby guaranteeing a high resolution of the organic electroluminescent device.

It should be noted that the rectangular light emitting region and hole transport region are just specific implementations, and shapes of the light emitting region and the second hole transport sub-region are not limited thereto. It is sufficient that the hole transport region covers the spacing between two adjacent projection regions and half of each projection regions. Thus, the two portions of different thicknesses of the hole transport layer at each projection region have the same area. In this way, the same selection of the wavelength range of light emitted by a light emitting region is obtained by microcavities of two thicknesses, thereby effectively improving the color deviation.

Clearly, various modifications and variations may be made by the skilled in the art to the embodiments of the present disclosure without departing from the spirit and scope of the present disclosure. As such, the disclosure is also intended to include all these modifications and variations, if the modifications and variations of the present disclosure pertain to the scope of the claims of the present disclosure and the equivalence thereof.

The invention claimed is:

1. An organic electroluminescent device, comprising:
   a light emitting layer, comprising a plurality of light emitting regions arranged in an array, each light emitting region being an organic electroluminescent region;
   an electron transport layer, a cathode and a transflective layer successively disposed in a first direction from the light emitting layer towards a light emergent side of the organic electroluminescent device starting from the light emitting layer; and
   a hole transport layer, an anode and a reflective layer successively disposed in a second direction opposite to the first direction starting from the light emitting layer,
   wherein in a projection region of one light emitting region on the hole transport layer, the hole transport layer has two flat portions of different thicknesses corresponding to the projection region, and each flat portion covers both projection regions of two adjacent light emitting regions on the hole transport layer and a region therebetween.

2. The organic electroluminescent device according to claim 1, wherein the two flat portions of different thicknesses cover half of the projection region respectively.

3. The organic electroluminescent device according to claim 1, wherein the plurality of light emitting regions comprise n light emitting regions emitting light of different colors respectively, wherein n is a natural number greater than or equal to 3.

* * * * *